United States Patent [19]
Nazarian

[11] Patent Number: 5,740,106
[45] Date of Patent: Apr. 14, 1998

[54] APPARATUS AND METHOD FOR NONVOLATILE CONFIGURATION CIRCUIT

[75] Inventor: Hagop A. Nazarian, San Jose, Calif.

[73] Assignee: Cypress Semiconductor Corp., San Jose, Calif.

[21] Appl. No.: 835,586

[22] Filed: Apr. 9, 1997

Related U.S. Application Data

[63] Continuation of Ser. No. 496,343, Jun. 29, 1995, abandoned.
[51] Int. Cl.$^6$ ..................................................... G11C 11/40
[52] U.S. Cl. ............................. 365/185.1; 365/185.16; 365/185.29; 365/185.14; 365/218
[58] Field of Search ........................... 365/185.1, 185.16, 365/185.29, 185.14, 218

[56] References Cited

U.S. PATENT DOCUMENTS

| | | | |
|---|---|---|---|
| 4,829,203 | 5/1989 | Ashmore, Jr. ............... | 365/185.1 |
| 5,088,066 | 2/1992 | Castro ......................... | 365/185.1 X |
| 5,101,378 | 3/1992 | Radji et al. ................... | 365/185.1 X |
| 5,329,487 | 7/1994 | Gupta et al. .................. | 365/185.1 X |

*Primary Examiner*—Do Hyun Yoo
*Attorney, Agent, or Firm*—Blakely, Sokoloff, Taylor & Zafman, LLP

[57] ABSTRACT

A configuration circuit includes a plurality of configuration cells where each configuration cell has (a) a nonvolatile pull-up cell coupled to an output node and for coupling to a first power supply voltage, and (b) a nonvolatile pull-down cell coupled to the nonvolatile pull-up cell and to the output node and for coupling to a second power supply voltage, where the nonvolatile pull-up cell includes a first nonvolatile transistor, and the nonvolatile pull-down cell includes a second nonvolatile transistor. The configuration cell may further include a volatile transistor in the nonvolatile pull-up and/or pull-down cells. In addition, the configuration cell may include a first erase device coupled to the first nonvolatile transistor for discharging charges on the floating gate of the first nonvolatile transistor and a second erase device coupled to the second nonvolatile transistor for discharging charges on the floating gate of the second nonvolatile transistor. Furthermore, the configuration cell can include a third nonvolatile transistor for programming the first nonvolatile transistor and a fourth nonvolatile transistor for programming the second nonvolatile transistor. The nonvolatile or volatile transistors included in the configuration cell may be an N-type or a P-type MOSFET having a floating gate, and each may be either an enhancement-type or a depletion-type. The configuration circuit may also include pass circuits to couple the configuration cell to the first and second power supply voltages and to programming lines.

38 Claims, 18 Drawing Sheets

| MODES OF OPERATION OF CONFIGURATION CELLS 80 & 82 | CL1 | EL1 | CL2 | EL2 | CL3 | VN1 | VN2 | OUTPUT 70 or OUTPUT 72 |
|---|---|---|---|---|---|---|---|---|
| PROGRAM M20 & ERASE M22 | HV (~12V) | HV (~11V) | 0 | HV (~11V) | 0 | HV (~7V) | 0 | 0 |
| PROGRAM M22 & ERASE M20 | 0 | HV (~11V) | HV (~12V) | HV (~11V) | HV (~12V) | 0 | HV (~7V) | 0 |
| READ (NORMAL OPERATION) | Vcc | Vcc - Vtn or Vcc | Vcc | Vcc - Vtn or Vcc | Vcc | Vcc | 0 | ① Vcc IF M22 PROGRAMMED & M20 ERASED ② 0 IF M20 PROGRAMMED & M22 ERASED |

Fig. 14

| MODES OF OPERATION OF CONFIGURATION CELLS 84 & 86 | CL1 | EL1 | PL1 | CL2 | EL2 | PL2 | CL3 | VN1 | VN2 | OUTPUT 74 OR OUTPUT 76 |
|---|---|---|---|---|---|---|---|---|---|---|
| PROGRAM M20 & ERASE M22 | HV | HV | HV | 0 | HV | 0 | X | X | X | X |
| PROGRAM M22 & ERASE M20 | 0 | HV | 0 | HV | HV | HV | X | X | X | X |
| READ (NORMAL OPERATION) | Vcc | Vcc − Vtn OR Vcc | 0 | Vcc | Vcc − Vtn OR Vcc | 0 | Vcc | Vcc | 0 | ① Vcc IF M22 PROGRAMMED & M20 ERASED<br>② 0 IF M20 PROGRAMMED & M22 ERASED |

| | DEVICES | PL10 | PL20 | PL30 | PL40 | EL10 | CL10 | EL20 | CL20 | A | B |
|---|---|---|---|---|---|---|---|---|---|---|---|
| PROGRAM | M20(0,0) | HV | 0 | 0 | 0 | HV | HV | 0 | 0 | Vcc | 0 |
| | M22(0,0) | 0 | HV | 0 | 0 | HV | HV | 0 | 0 | Vcc | 0 |
| | M20(0,1) | HV | 0 | 0 | 0 | 0 | 0 | HV | HV | Vcc | 0 |
| | M22(0,1) | 0 | HV | 0 | 0 | 0 | 0 | HV | HV | Vcc | 0 |
| | M20(1,0) | 0 | 0 | HV | 0 | HV | HV | 0 | 0 | Vcc | 0 |
| | M22(1,0) | 0 | 0 | 0 | HV | HV | HV | 0 | 0 | Vcc | 0 |
| | M20(1,1) | 0 | 0 | HV | 0 | 0 | 0 | HV | HV | Vcc | 0 |
| | M22(1,1) | 0 | 0 | 0 | HV | 0 | 0 | HV | HV | Vcc | 0 |
| BULK ERASE | | 0 | 0 | 0 | 0 | HV | 0 | HV | 0 | Vcc | 0 |
| READ (NORMAL OPERATION) | | 0 | 0 | 0 | 0 | Vcc-Vt (~4v) | Vcc-Vt (~5v) | Vcc-Vt (~4v) | Vcc (5v) | 0 | Vcc |

CONTROL LINES

APPARATUS AND METHOD FOR NONVOLATILE CONFIGURATION CIRCUIT

This is a continuation of application Ser. No. 08/496,343, filed Jun. 29, 1995, now abandoned.

BACKGROUND OF THE INVENTION

1. Field of the Invention

The present invention relates to the field of nonvolatile memory devices and, in particular, to nonvolatile programmable configuration cells.

2. Description of the Related Art

FIG. 1 shows a typical programmable logic device (PLD) 10 which contains an array of logic gates that can be connected or programmed to perform various functions. PLD 10 includes a programmable AND array 12, a plurality of macrocells 14, a programmable configuration circuit 16 and drivers 18. Programmable AND array 12 can be programmed according to desired logic equations. The outputs of programmable AND array 12 are provided to macrocells 14 which are controlled by configuration circuit 16. Each of macrocells 14 provides the capability of defining the architecture of its output individually. A block diagram of one of macrocells 14 is shown in FIG. 2.

Now referring to FIG. 2, macrocell 14 includes a D flip-flop 22, an output select mux 24, and an output enable mux 26. Each of these devices (22, 24 and 26) are controlled by configuration bits ($C_0$, $C_1$, and $C_2$) that are provided by configuration circuit 16. The configuration bits determine how data will be handled from programmable AND array 12 (e.g., registered through D flip-flop 22, combinatorial path with output select mux 24, or output enable mux 26).

Configuration circuit 16 in FIG. 1 includes a plurality of configuration cells. A conventional configuration cell is shown in FIG. 3. A configuration cell 30 includes a nonvolatile cell 32, a sense amplifier 34, and an isolation inverter A12.

Nonvolatile cell 32 typically includes a volatile transistor M4 and a nonvolatile transistor M5. Nonvolatile cell 32 can be either erased (M5 conducts) or programmed (M5 does not conduct). If nonvolatile cell 32 is erased, and power is provided to nonvolatile cell 32, then current flows through transistors M4 and M5. However, if nonvolatile cell 32 is programmed, then no current flows through transistors M4 and M5 even if power is applied to nonvolatile cell 32.

Sense amplifier 34 includes a cascode transistor M6, a power-on reset transistor M1, a feedback transistor M2, a PMOS transistor M3, and a feedback inverter A10. Sense amplifier 34 is provided to determine whether nonvolatile cell 32 is erased or programmed by sensing the current flowing through nonvolatile cell 32 during power up and to generate an output logic level at node A.

Isolation inverter A12 is used to invert the signal at node A, and to isolate node A from the rest of the circuit that is connected to node B.

To read the data stored in nonvolatile cell 32, Vcc is applied to the source of transistor M3, and the gate of M3 is connected to Vss (or ground). A reference voltage is applied to the gate of cascode transistor M6. The reference voltage, however, must be less than (2V+Vtn). This is because nonvolatile cell 32 cannot handle a potential difference above two volts between the drain and source of the nonvolatile cell. Otherwise, nonvolatile cell 32 will be disturbed, causing serious reliability problems. The gates of transistors M4 and M5 are connected to Vcc, and the source of transistor M5 is connected to Vss.

At power-up, a PORb signal provided to the gate of M1 is pulsed low for a short period of time to activate the sense amplifier's cascode path. Thus, for that short period of time, current flows from Vcc through transistors M3, M1 and M6. After the short period of time, the PORb signal goes high, and transistor M1 is turned off. If nonvolatile cell 32 is erased, then node C will be pulled down to Vss through cascode transistor M6 and nonvolatile cell 32. Feedback inverter A10 disables feedback transistor M2 since node C is logic low. Thus, node C will remain logic low (logic 0). Hence, the output at node B is a logic 0 when nonvolatile cell 32 is erased. If, on the other hand, nonvolatile cell 32 is programmed, then node C will be pulled up (logic 1) at power-up through transistors M3 and M1. Even when M1 turns off, because feedback inverter A10 will pull down the gate of M2 low, M2 will be on. Hence, node C will remain logic high (logic 1). Accordingly, node A will be logic low, and the output at node B will be a logic 1.

Another conventional configuration cell is shown in FIG. 4. A configuration cell 40 includes a nonvolatile cell 42 and a sense amplifier 44. Like nonvolatile cell 32 in FIG. 3, nonvolatile cell 42 in FIG. 4 includes a volatile transistor M4' and a nonvolatile transistor M5'. Sense amplifier 44 in FIG. 4 includes a PMOS transistor M3' and a cascode transistor M6'. Sense amplifier 44 differs from sense amplifier 34 in that sense amplifier 44 does not have a power-on reset circuit, a feedback transistor or a feedback inverter.

In operation, if nonvolatile cell 42 is erased, and the total combined size (pull down strength) of transistors M6', M4' and M5' is larger than the size of transistor M3' (i.e., the input resistance of M6', M4' and M5' is less than that of M3'), then the output at node D will be a logic 0. If, on the other hand, nonvolatile cell 42 is programmed, then nonvolatile cell 42 does not conduct current, and the output at node D will be a logic 1.

Although the prior art schemes shown in FIGS. 3 and 4 provide full rail logic levels by incorporating sense amplifiers, the prior art schemes have several disadvantages. First, because the conventional configuration cells require sense amplifiers, they consume a large amount of silicon area. Sense amplifiers (in FIG. 3) typically require three times more area than nonvolatile cells. Second, the configuration cell shown in FIG. 3 requires an additional power-up control circuitry (e.g., PORb) and a reference generator to clamp the drain voltage of nonvolatile cell 32 at Vref-Vtn. Third, with respect to the second approach shown in FIG. 4, although the design is simpler than the one shown in FIG. 3 and consumes less silicon area in comparison, it always consumes some DC current if nonvolatile cell 42 is erased. At power-up, there will be a large DC current flowing through transistors M3', M6', M4' and M5'. Thus, the second approach shown in FIG. 4 is not suitable for complex programmable logic devices (CPLD's) because such CPLD's require a large number of configuration cells. Nor is this approach suitable in products requiring low stand-by power consumption.

Therefore, there is a need for a configuration circuit that not only provides full rail logic levels but also consumes less amount of silicon area by eliminating devices such as a sense amplifier, power-up control circuitry and reference generator. It is also crucial to minimize power consumption of a chip, especially when the chip includes a large number of configuration cells.

SUMMARY OF THE INVENTION

A configuration circuit according to the present invention is capable of providing full rail logic levels, minimizing the circuit area and power consumption, and having the smallest transistors that can be made using a particular technology employed. In addition, the configuration circuit of the present invention does not require a sense amplifier, a power-on reset circuitry, or a reference voltage generator.

A configuration circuit of the present invention typically includes a plurality of configuration cells where each configuration cell has (a) a nonvolatile pull-up cell coupled to an output node and for coupling to a first power supply voltage, and (b) a nonvolatile pull-down cell coupled to the nonvolatile pull-up cell and to the output node and for coupling to a second power supply voltage, where the nonvolatile pull-up cell includes a first nonvolatile transistor, and the nonvolatile pull-down cell includes a second nonvolatile transistor.

The configuration cell may further include a volatile transistor in the nonvolatile pull-up and/or pull-down cells. In addition, the configuration cell may include a first erase device coupled to the first nonvolatile transistor for discharging charges on the floating gate of the first nonvolatile transistor and a second erase device coupled to the second nonvolatile transistor for discharging charges on the floating gate of the second nonvolatile transistor. Furthermore, the configuration cell can include a third nonvolatile transistor for programming the first nonvolatile transistor and a fourth nonvolatile transistor for programming the second nonvolatile transistor.

The nonvolatile or volatile transistors included in the configuration cell may be an N-type or a P-type MOSFET having a floating gate, and each may be either an enhancement-type or a depletion-type. If the nonvolatile pull-up cell includes a P-type MOSFET and the nonvolatile pull-down cell includes an N-type MOSFET, the floating gates of the two MOSFETs can be connected to each other.

The configuration circuit may also include pass circuits to couple the configuration cell to the first and second power supply voltages and to programming lines.

While both the nonvolatile pull-up and pull-down cells can be in erased states, typically only one of them is programmed.

In operation, at least one of the nonvolatile pull-up or pull-down cell is erased, the other one of the nonvolatile pull-up or pull-down cell is programmed, and the logic stored in the configuration cell is read. In the erase mode, both the nonvolatile pull-up and pull-down cells can be erased simultaneously using the erase devices or UV light. In addition, the steps of erasing one of the nonvolatile pull-up or pull-down cell and programming the other one can be done simultaneously or separately.

BRIEF DESCRIPTION OF THE DRAWINGS

The features, aspects, and advantages of the present invention will become more thoroughly apparent from the following detailed description, appended claims, and accompanying drawings in which:

FIG. 14 is a table showing the status of the signal lines in FIGS. 12 and 13 during different modes of operation;

FIG. 19 is a table showing the status of the signal lines in FIGS. 17 and 18 during different modes of operation;

FIG. 21 is a table summarizing the status of the control lines in FIG. 20 during different modes of operation.

DETAILED DESCRIPTION OF THE INVENTION

In the following description, numerous specific details are set forth to provide a thorough understanding of the present invention. However, one having an ordinary skill in the art may be able to practice the invention without these specific details. In some instances, well-known circuits, structures and techniques have not been shown in detail not to unnecessarily obscure the present invention.

Figure 1:
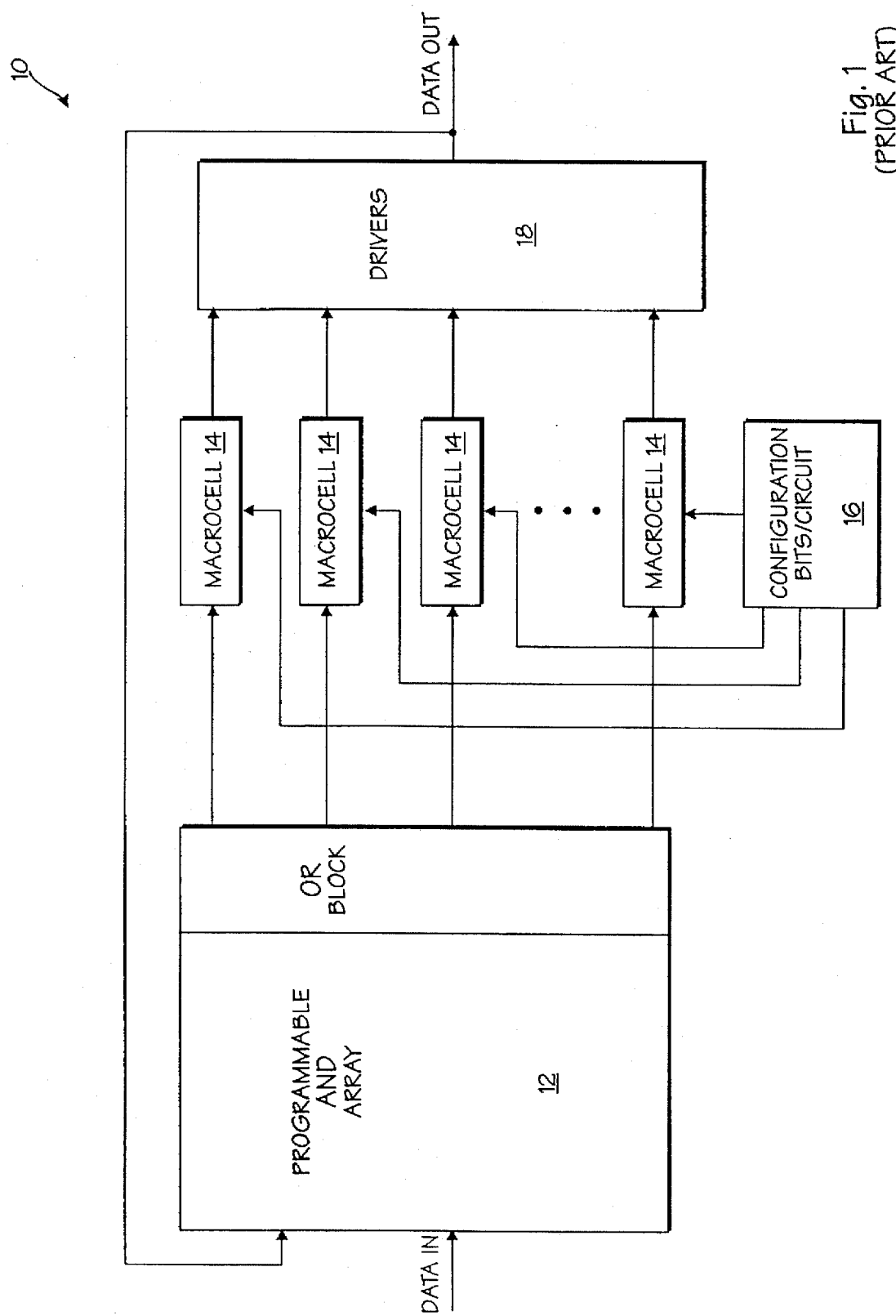
FIG. 1 is a block diagram of a conventional programmable logic device (PLD)
Figure 2:
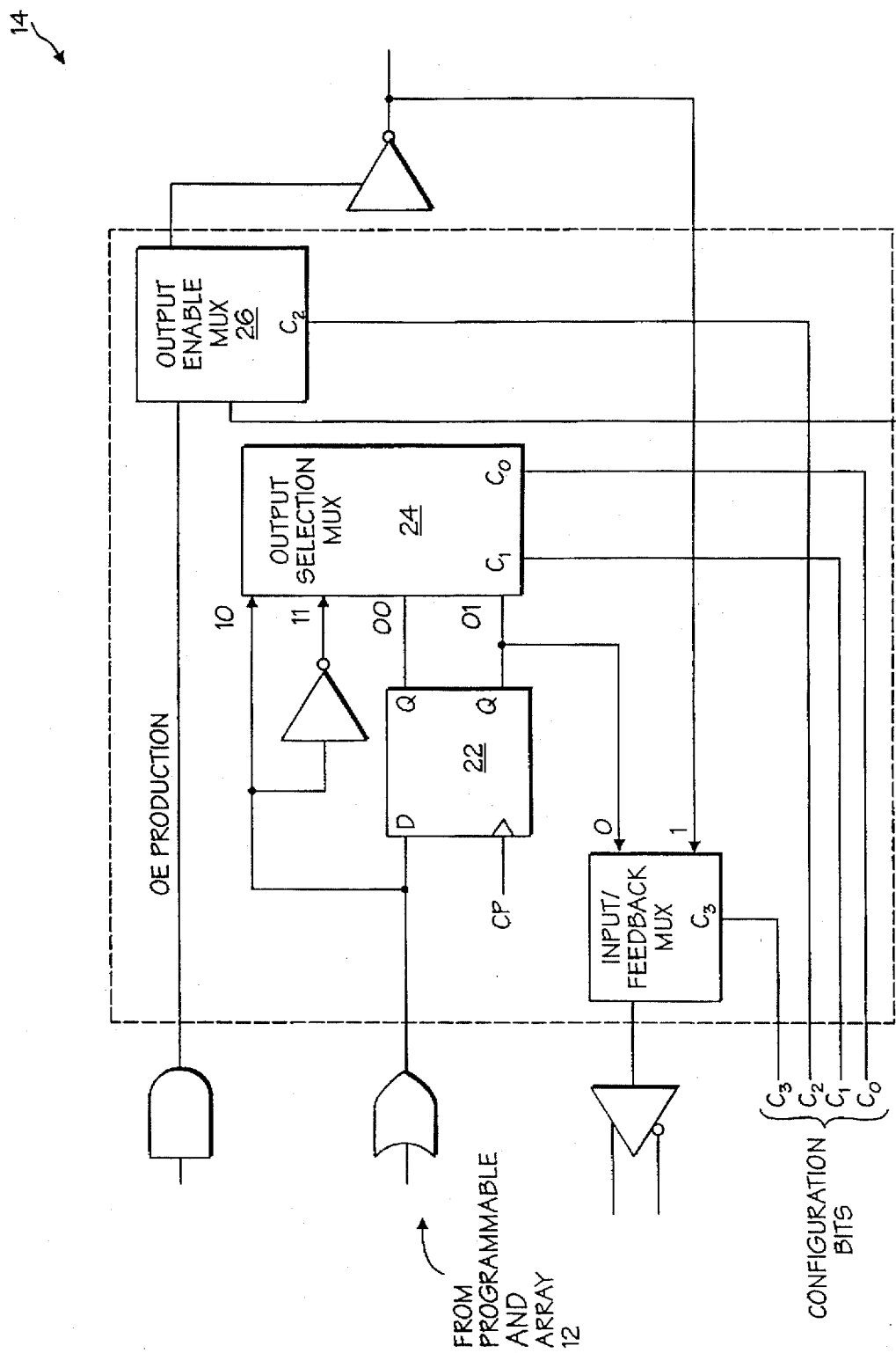
FIG. 2 is a block diagram of a conventional macrocell of the PLD of FIG. 1.
Figure 3:
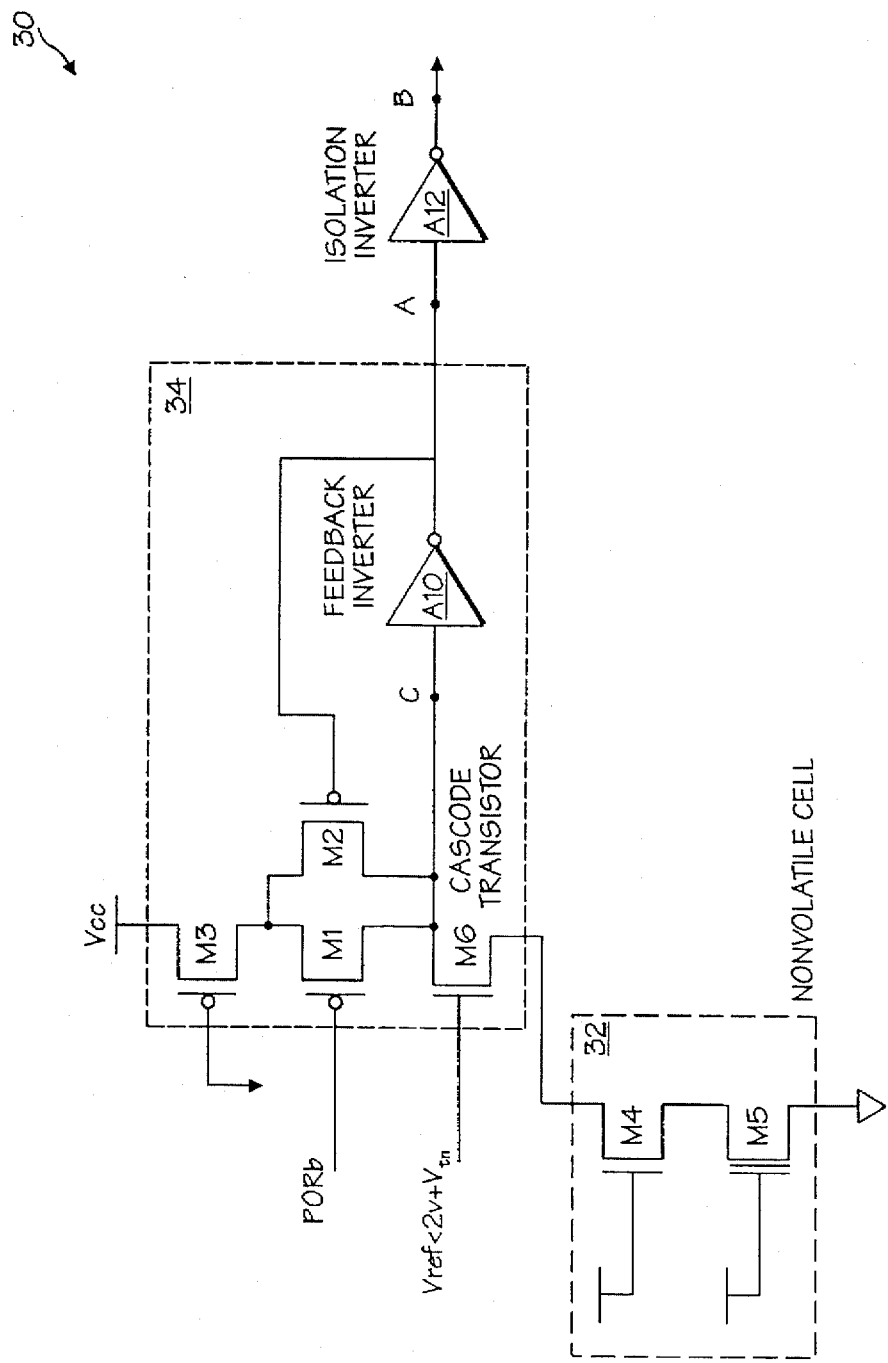
FIG. 3 is a circuit schematic representation of a prior art configuration cell.
Figure 4:
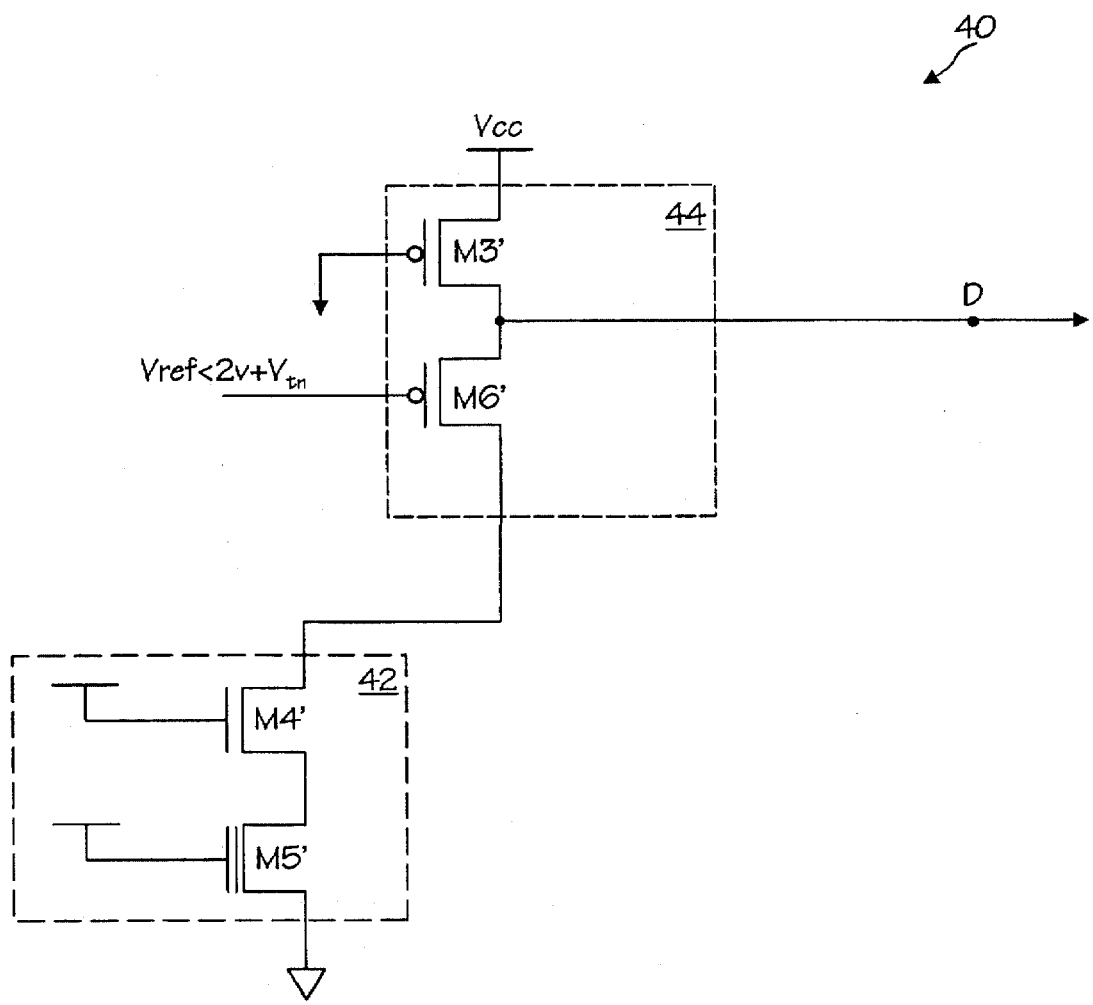
FIG. 4 is a circuit schematic representation of another conventional configuration cell.
Figure 5:
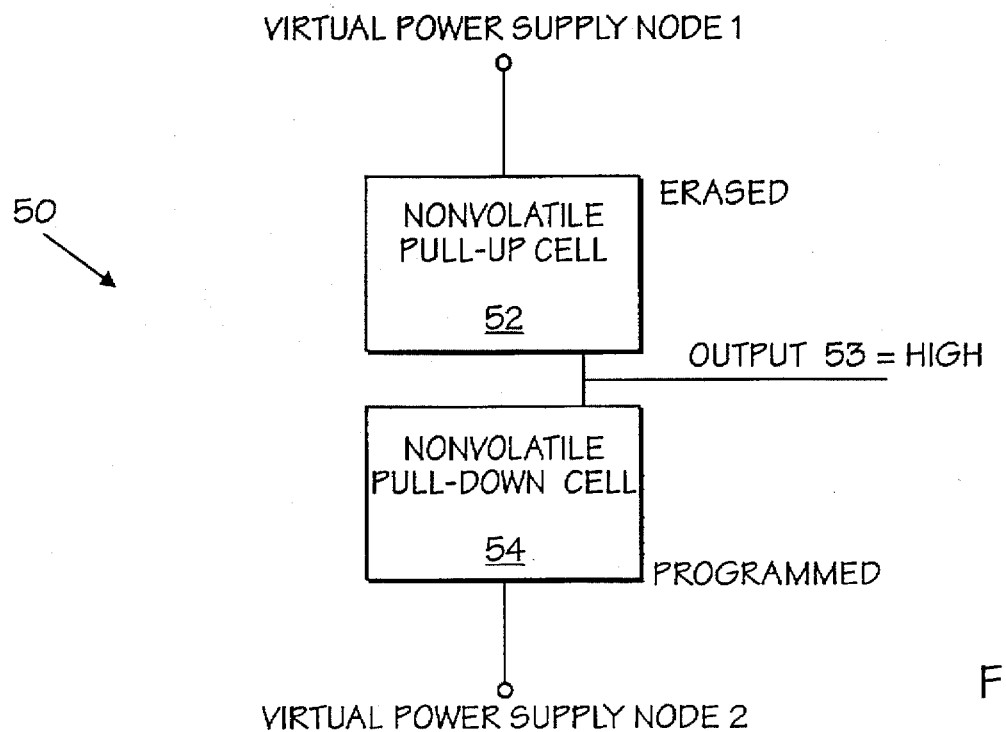
FIG. 5 is a block diagram of a configuration cell embodying features of the present invention and illustrating one mode of operation.

Referring first to FIG. 5, a configuration cell 50 embodying the features of the present invention is provided. Configuration cell 50 includes two nonvolatile cells—a nonvolatile pull-up cell 52 and a nonvolatile pull-down cell 54—that are capable of providing full rail logic levels. A nonvolatile cell can have different types of programmable devices including, but not limited to, an electrically programmable and electrically erasable read-only memory (EEPROM) and a flash EPROM. While each of the nonvolatile pull-up and pull-down cells includes at least one nonvolatile device, it may include volatile devices as well. It should be noted that a configuration cell of the present invention does not have a sense amplifier, a power-up control circuitry, or a reference generator that is required in a conventional configuration cell, as shown in FIG. 3.

Figure 6:
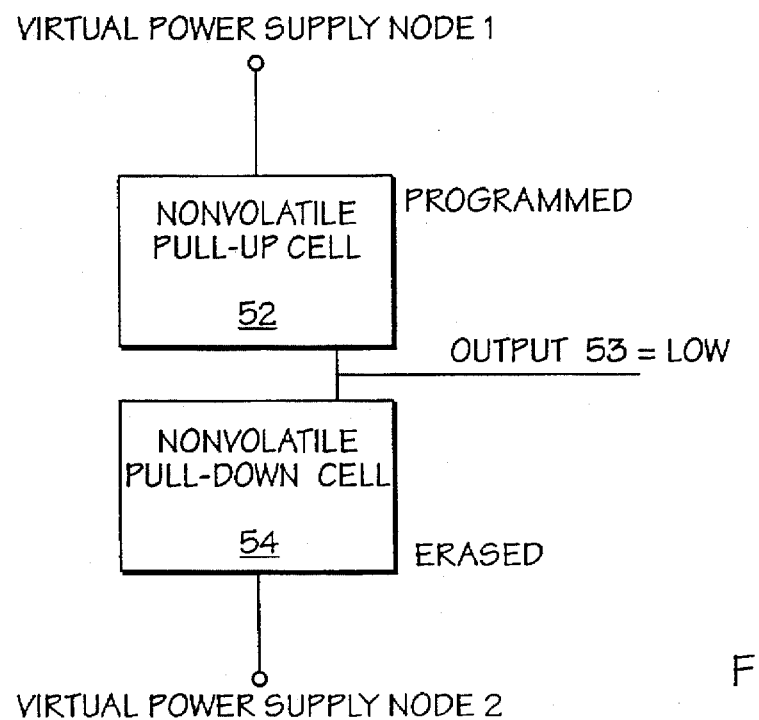
FIG. 6 is a block diagram of the configuration cell of FIG. 5 illustrating another mode of operation.

Continuing to refer to FIG. 5, nonvolatile pull-up cell 52 is connected to a virtual power supply node 1 that can be connected to a power supply voltage (e.g., Vcc, Vss, ground, or a voltage higher or lower than Vcc or Vss). Nonvolatile pull-down cell 54 is connected to a virtual power supply node 2 that can be also connected to a power supply voltage. During the program or erase mode, virtual power supply nodes 1 and 2 may be connected to any one of the power supply voltages mentioned earlier depending on the particular method of programming and erasing. However, during a read operation, virtual power supply nodes 1 and 2 are typically connected to Vcc and Vss (or ground), respectively. Both nonvolatile pull-up cell 52 and nonvolatile pull-down cell 54 are connected to an output node 53 to generate a logic 1 or a logic 0 at that node depending on the logic stored in the nonvolatile cells. During a read operation, if nonvolatile pull-up cell 52 is erased, and nonvolatile pull-down cell 54 is programmed, then output node 53 will be high, as shown in FIG. 5. On the other hand, if nonvolatile pull-up cell 52 is programmed, and nonvolatile pull-down cell 54 is erased, then output node 53 will be low, as shown in FIG. 6.

Figure 7A:
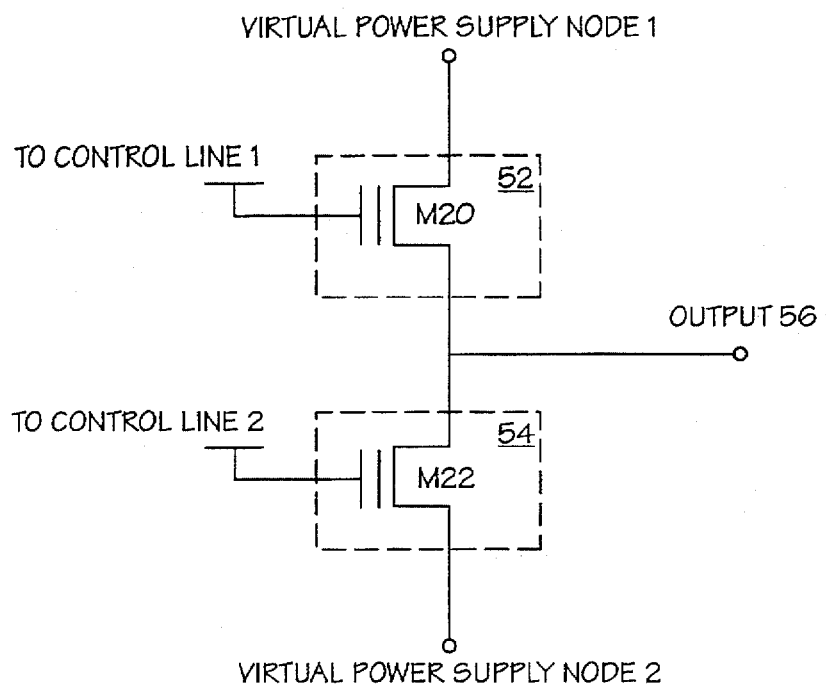
FIG. 7a is a circuit schematic representation of a configuration cell according to one embodiment of the present invention.

FIGS. 7a–11 are circuit schematic representations of configuration cells according to various embodiments of the present invention. FIG. 7a shows a configuration cell 70 according to one embodiment of the present invention. Configuration cell 70 includes a nonvolatile NMOS transistor M20 in nonvolatile pull-up cell 52 and a nonvolatile NMOS transistor M22 in nonvolatile pull-down cell 54. A nonvolatile MOSFET incorporated in a configuration cell can be an enhancement-type or a depletion-type or PMOS.

Figure 15A:
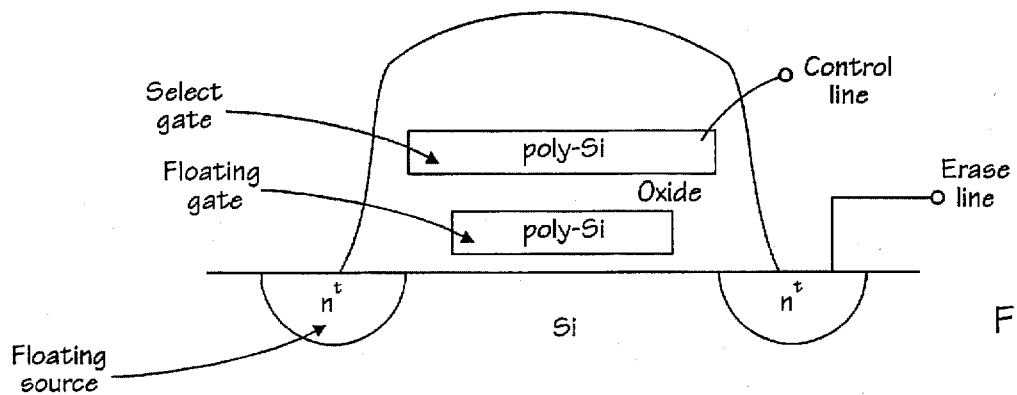
FIG. 15a–15d are cross-sectional views of various nonvolatile devices.
Figure 15B:
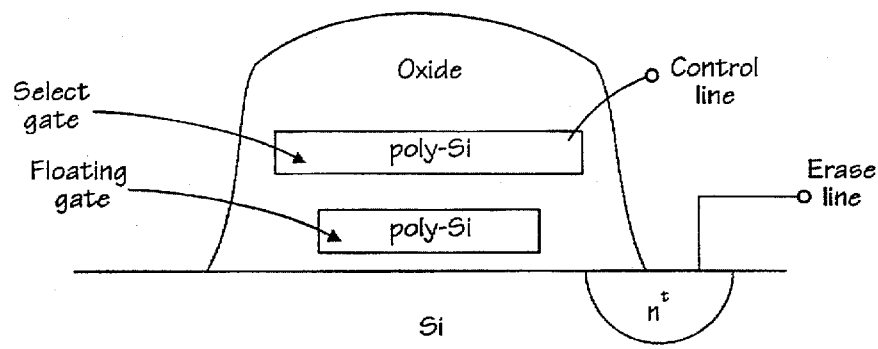
Figure 15C:
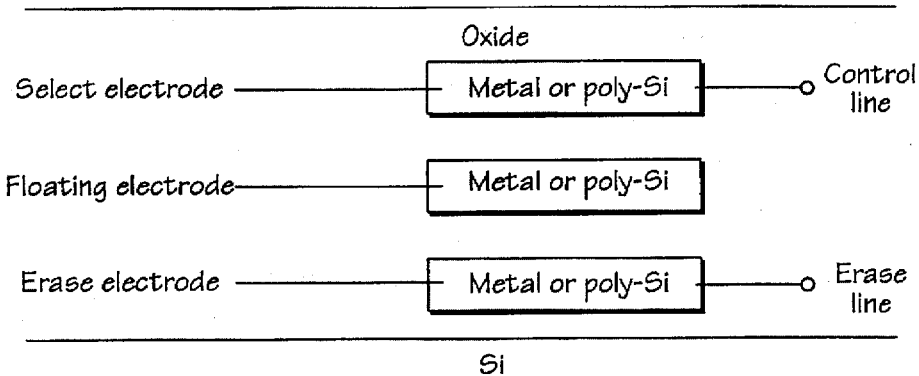
Figure 15D:
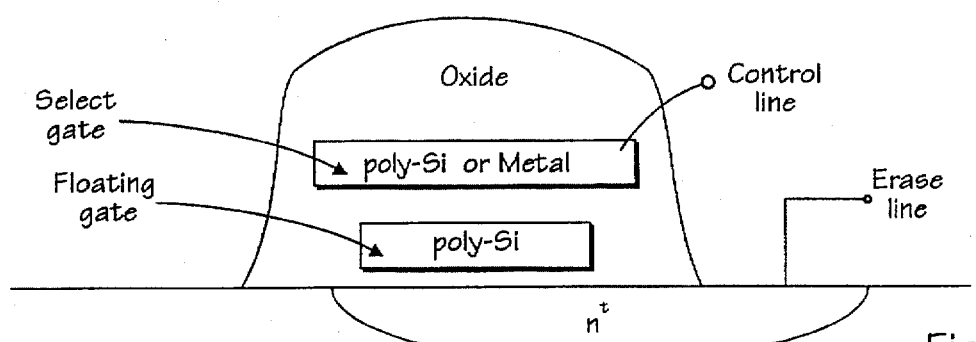
Figure 16:
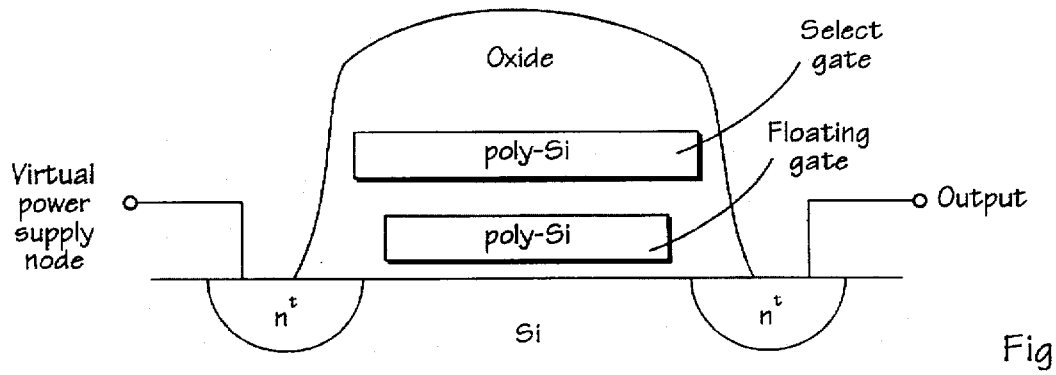
FIG. 16 is a cross-sectional view of a nonvolatile NMOS transistor.

FIG. 16 shows a typical cross-sectional structure of a nonvolatile NMOS transistor. The transistor includes a select gate and a floating gate both of which are typically made of poly-silicon, a source and a drain that are highly doped N-type silicon, and a substrate which is P-type silicon. One of the drain or source is connected to an output node, and the other is connected to a virtual power supply node in a typical situation. To program the transistor, typically a high voltage is applied to one of the drain or source, and Vss or ground is applied to the other while the select gate is connected to a high voltage so that electrons will tunnel through the oxide to the floating gate due to the high electric field formed at the drain side of the channel. To erase the transistor, the control line (e.g., FIG. 15d) is grounded and high voltage is applied to the erase line (e.g., FIG. 15d). Also, the transistor can be erased when exposed with UV light.

In FIG. 7a, while NMOS transistor M22 is an enhancement-type, NMOS transistor M20 is preferably a depletion-type (negative threshold voltage) so that an output node 56 can reach the full rail logic levels (e.g., Vcc and Vss). Nonvolatile NMOS transistors M20 and M22 each include a select gate, a floating gate, a drain and a source. The select gate of M20 is coupled to a control line 1, the drain is coupled to virtual power supply node 1, and the source is coupled to output node 56. The select gate of M22 is coupled to a control line 2, its drain is coupled to output node 56, and its source is coupled to virtual power supply node 2. It should be noted that control lines 1 and 2 may be connected to each other.

Figure 7B:
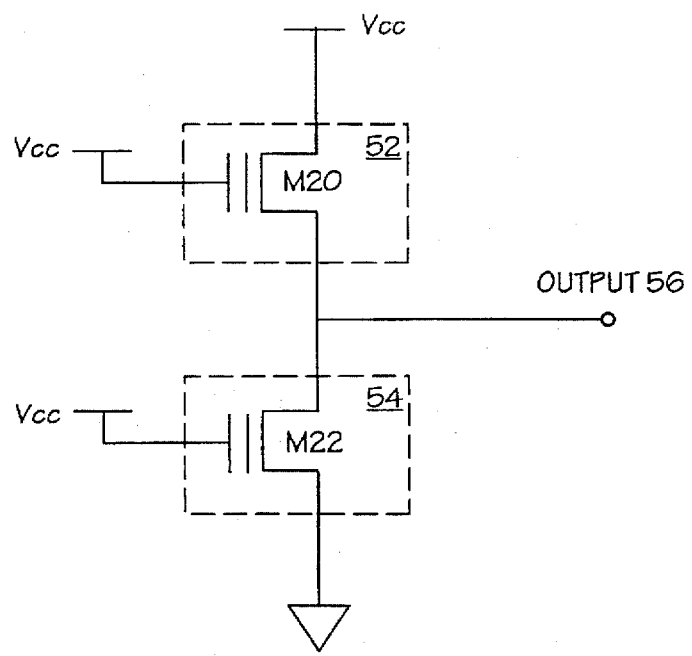
FIG. 7b is a circuit schematic representation of the configuration cell in FIG. 7a during a read operation.

FIG. 7b shows the configuration cell 70 of FIG. 7a during a read operation. During this operation, the drain and the select gate of NMOS transistor M20 are typically coupled to Vcc. NMOS transistor M22 has its select gate coupled to Vcc, and its source coupled to ground. To provide logic high at output node 56, NMOS transistor M20 is in an erased state, and NMOS transistor M22 is in a programmed state. If transistor M20 is erased and has positive $v_T$, then output node 56 will be at Vcc-Vtn where Vtn is the threshold voltage of transistor M20. If, however, transistor M20 is erased and has negative $v_T$ (depletion type), then output node 56 can reach the full rail high logic level—Vcc. If NMOS transistor M20 is programmed while NMOS transistor M22 is erased, then output node 56 will be low. Regardless of whether transistor M22 has positive (typically less than 1.5 volts) or negative (typically below zero volts) $V_T$, an erased M22 will allow output node 56 to reach the full rail low logic level-ground. It should be noted that when one of the nonvolatile cells are programmed, the other one is erased. Hence, only one of the cells is programmed.

Figure 8:
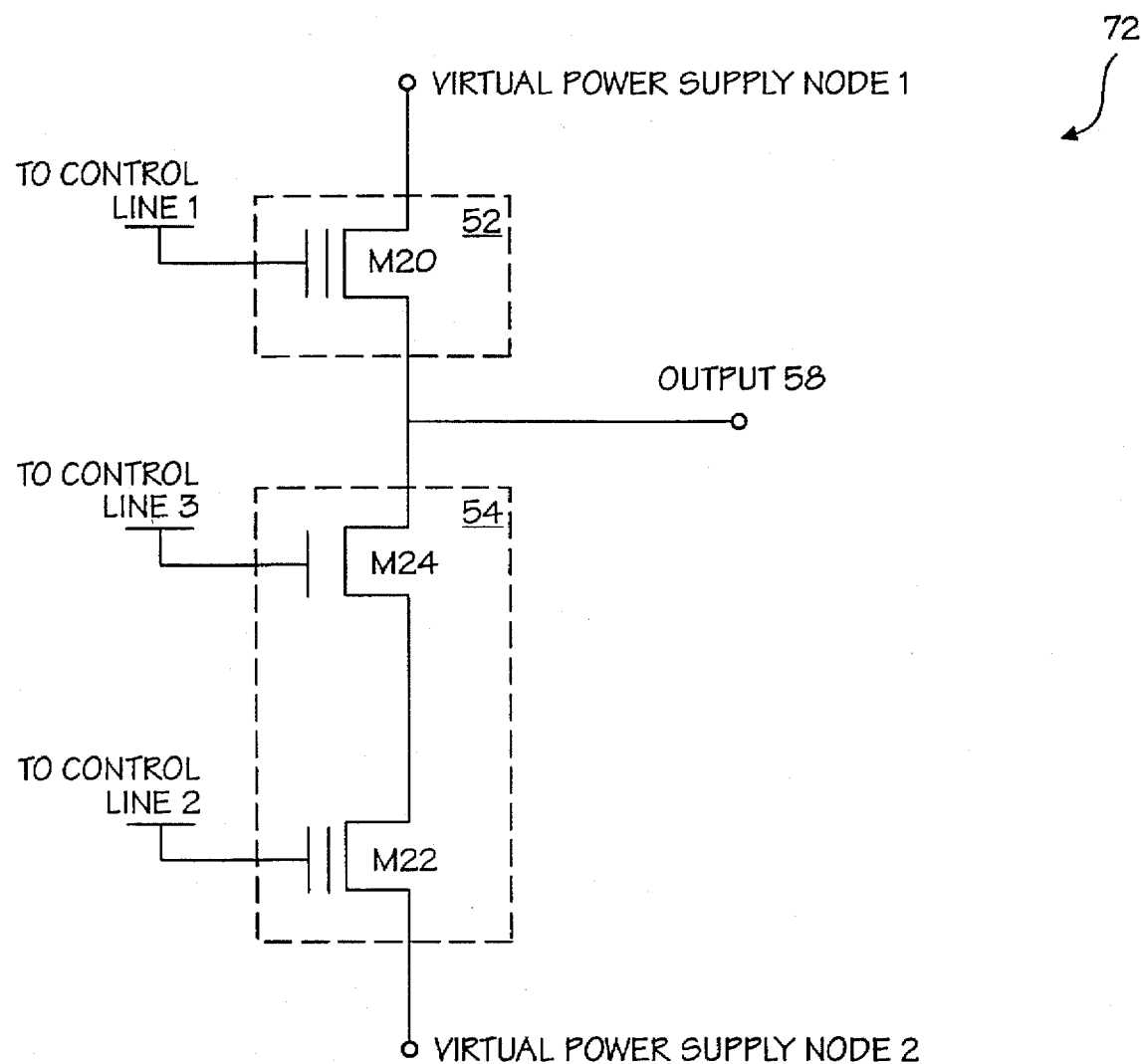
FIG. 8 is a circuit schematic representation of a configuration cell according to a second embodiment of the present invention.

While configuration cell 70 provides the full rail logic levels at the output and occupies a minimum area, there is one disadvantage. If NMOS transistors M20 and M22 are both erased (e.g., the configuration cell is erased prior to programming one of the nonvolatile cells), and the transistors are connected to various power and control lines as shown in FIG. 7b, then transistors M20 and M22 will conduct and consume power. To avoid this problem, an NMOS transistor M24 can be included as shown in FIG. 8 and cut off the current path, if necessary. It should be noted that there are other ways to cut off the current path without having the extra transistor M24. This will be described later referring to FIG. 20.

In FIG. 8, a configuration cell 72 includes nonvolatile NMOS transistor M20 in nonvolatile pull-up cell 52, and volatile NMOS transistor M24 and nonvolatile NMOS transistor M22 in nonvolatile pull-down cell 54. Configuration cell 72 is basically the same as configuration cell 70 in FIG. 7a except that configuration cell 72 includes volatile NMOS transistor M24 which is connected to a control line 3. During a read operation, an output node 58 will be high or low depending on the states of nonvolatile cells 52 and 54. The gates of NMOS transistors M20, M22 and M24 are typically connected to Vcc during the read operation. Thus, NMOS transistor M24 (the read path transistor) will be turned on. The read operation of configuration cell 72 is similar to the read operation of configuration cell 70. Output node 58 will be high (e.g., Vcc) if NMOS transistor M20 is erased, and NMOS transistor M22 is programmed. Output node 58 will be low (e.g., Vss or ground) if NMOS transistor M20 is programmed while NMOS transistor M22 is erased. In FIG. 8, because of NMOS transistor M24, even if the control lines 1 and 2 exceed the threshold voltages of NMOS transistors M20 and M22, a current path through M20, M24 and M22 can be cut off by turning off M24. However, the disadvantage of configuration cell 72 is that it requires more area than that of configuration cell 70 because of transistor M24. Thus, in a large array of configuration cells, it may be desirable to employ configuration cell 70 rather than configuration cell 72 and incorporate another scheme to cut off the current path. This will be described later with respect to FIG. 20.

Figure 9:
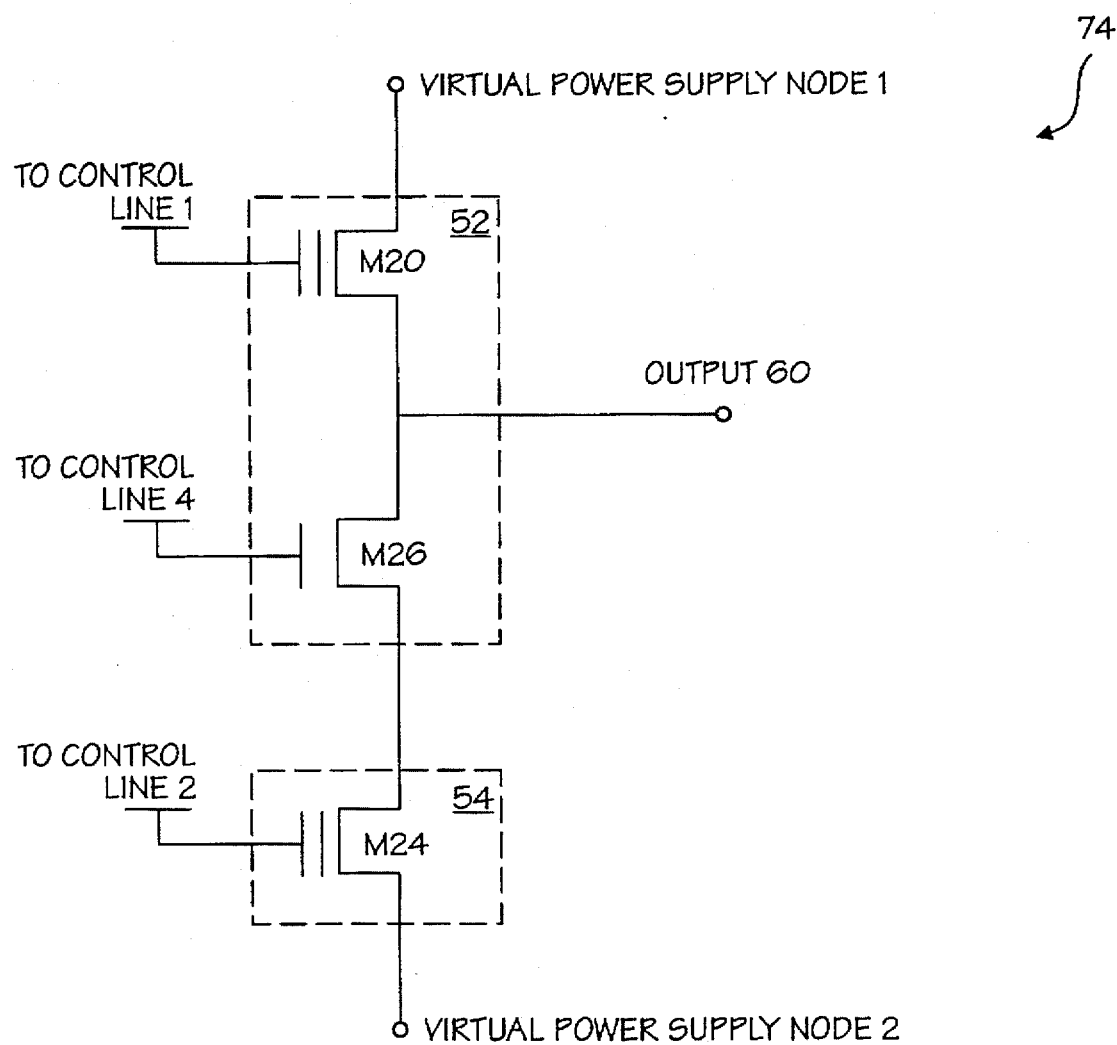
FIG. 9 is a circuit schematic representation of a configuration cell according to a third embodiment of the present invention.
Figure 10:
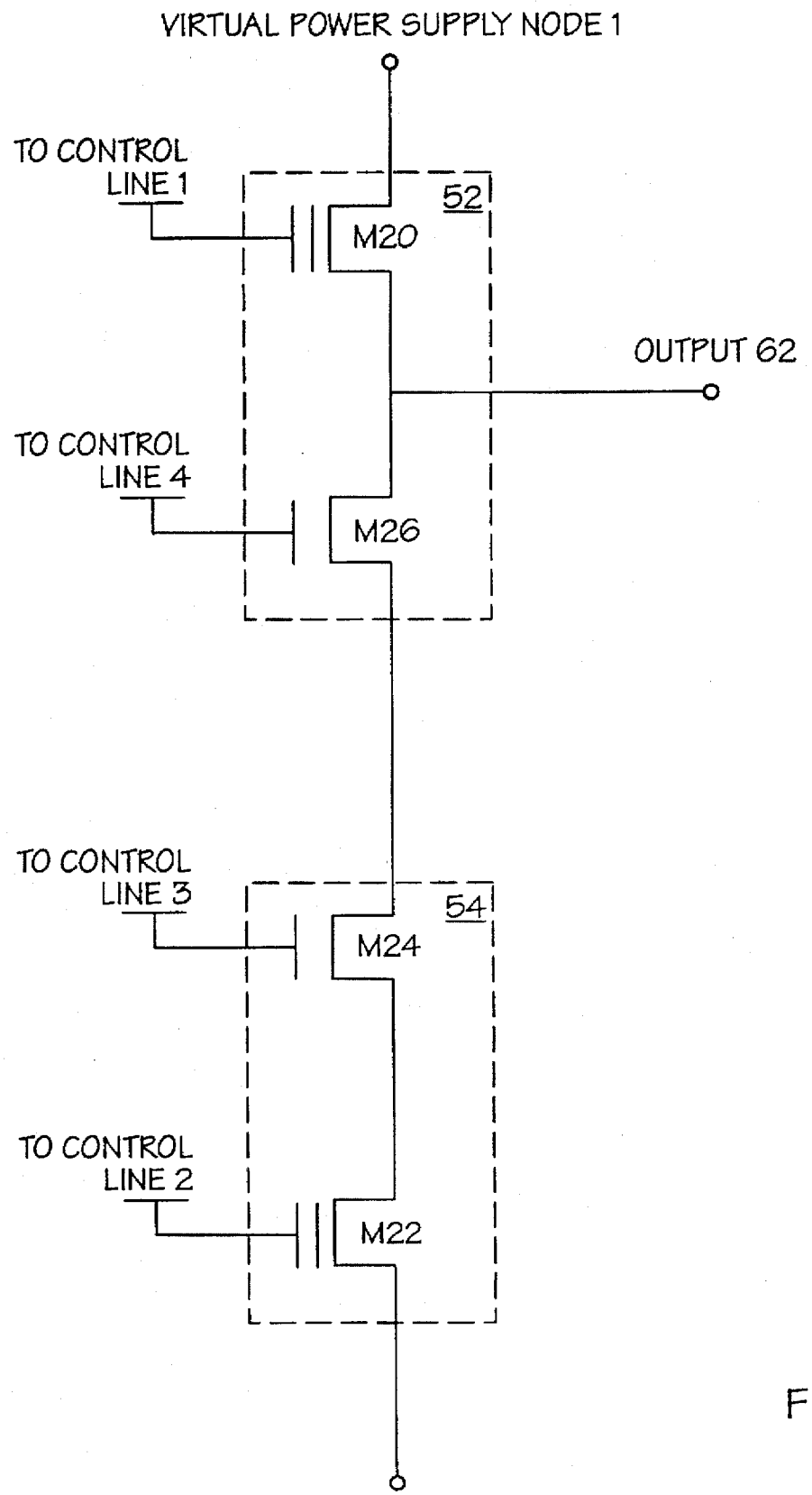
FIG. 10 is a circuit schematic representation of a configuration cell according to a fourth embodiment of the present invention.

Other alternative embodiments of the present invention are presented in FIGS. 9 and 10. The configuration cells in FIGS. 9 and 10 are similar to that in FIG. 7a except for the following. In FIG. 9, a volatile NMOS transistor M26 is included in nonvolatile pull-up cell 52. In FIG. 10, one volatile NMOS transistor M26 is included in nonvolatile pull-up cell 52, and another volatile NMOS transistor M24 is included in nonvolatile pull-down cell 54. The configuration cells in FIG. 9 and 10 operate in a manner similar to the operation of configuration cell 72. One difference is that output node 60 or 62 can not reach the full rail high logic level (i.e., Vcc) when transistor M26 is an enhancement-type. The high logic level of output node 60 or 62 is Vcc-Vtn where Vtn is the threshold voltage of M26, unless M26 is a depletion-type. It should be noted that in other embodiments, instead of using NMOS transistors, PMOS transistors may be employed for any of the nonvolatile or volatile transistors. When PMOS transistors are used, the voltages need to be reversed appropriately.

Figure 11:
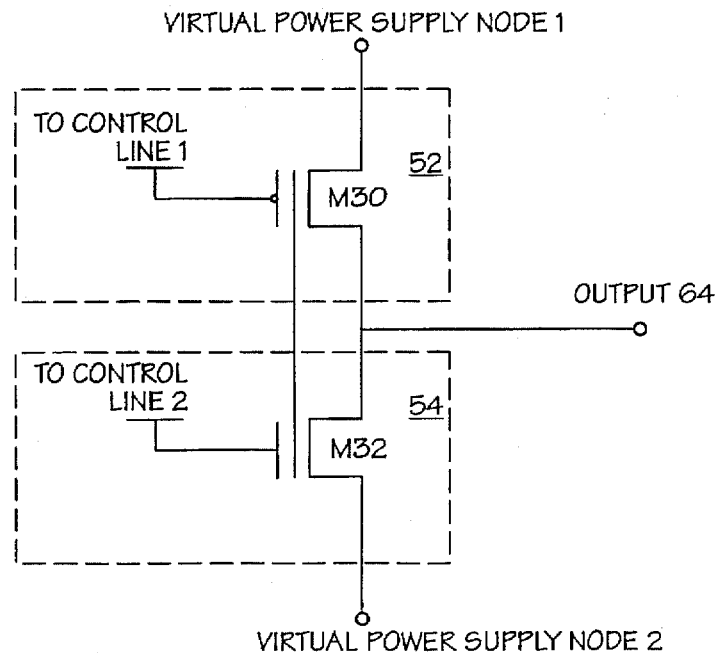
FIG. 11 is a circuit schematic representation of a configuration cell according to a fifth embodiment of the present invention.

FIG. 11 shows a configuration cell 78 according to yet another embodiment of the present invention. Nonvolatile pull-up cell 52 in FIG. 11 includes a nonvolatile PMOS transistor M30, and nonvolatile pull-down cell 54 includes a nonvolatile NMOS transistor M32. Although transistors M30 and M32 can have two separate floating gates, in this embodiment, transistors M30 and M32 include a single floating gate that is shared by both transistors, hence, occupying less area. During a read operation, the source of PMOS transistor M30 is typically connected to Vcc while its select gate is connected to Vss (or ground). In addition, the source of NMOS transistor M32 is connected to Vss (or ground), and its select gate is connected to Vcc. An output node 64 of configuration cell 78 can reach the full rail logic levels. If, however, a transistor such as transistor M26 in an enhancement-mode is included in nonvolatile pull-up cell 52, then the high logic level will be at Vcc-Vtn. It should be noted that the various embodiments described above are only some examples, and there are numerous other embodiments that the present invention can realize.

Figure 12:
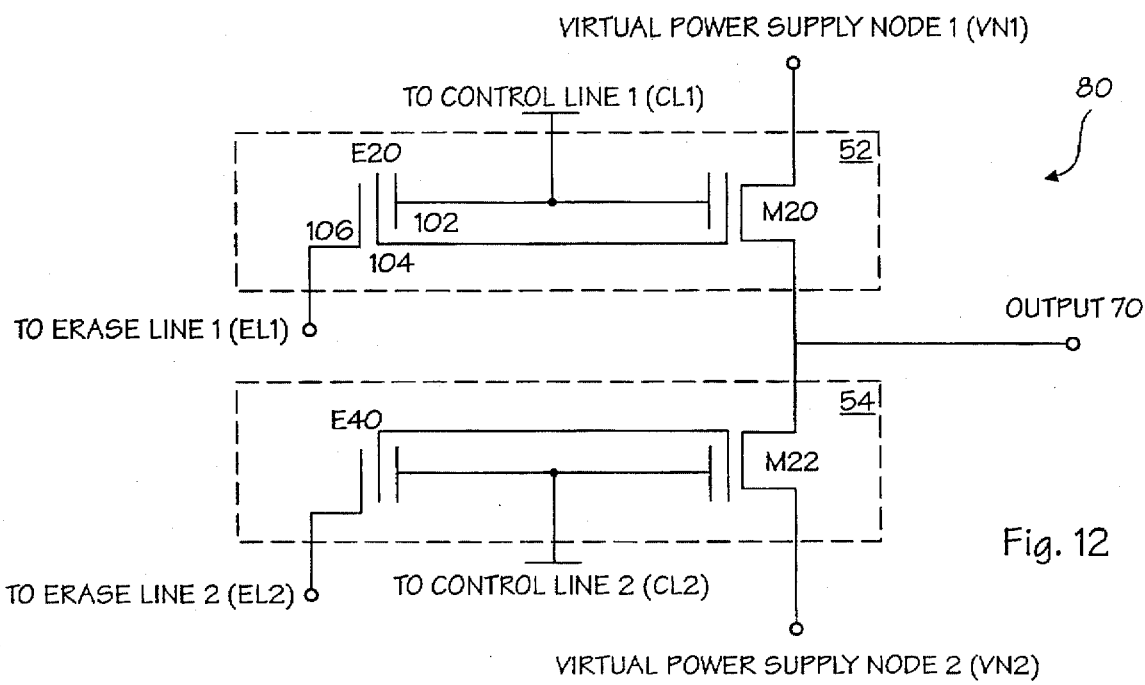
FIG. 12 is a circuit schematic representation of a configuration cell having erase devices according to one embodiment of the present invention.

FIGS. 12–19 illustrate different modes of operation of configuration cells according to the present invention incorporating erase and programming devices. Configuration cell 80 in FIG. 12 is substantially configuration cell 70 in FIG. 7a except that configuration cell 80 includes two erase devices—E20 and E40. An erase device such as E20 or E40 can be constructed in many different ways. FIGS. 15a–15d show some examples. The structure shown in FIG. 15a is basically a nonvolatile NMOS transistor having a floating gate and a floating source. Hence, the floating source is not coupled to any device or a node. An example of a device with such a structure is transistor M20 in FIG. 17. In FIG. 15b, an erase device is a nonvolatile NMOS transistor without a source area. An example of such an erase device is E40 in FIG. 17. In FIG. 15c, an erase device is a capacitor having three electrodes: a select electrode, a floating electrode and an erase electrode. The erase device in FIG. 15d is similar to that in FIG. 15b except that the drain area (N+) extends to cover the area under the floating gate. An example of such a device is E20 in FIG. 17. In FIGS. 15a–15d, it should be noted that various gates and electrodes can be either metal, polysilicon, or some other conductive material (s). The substrate is typically silicon, but it may be other semiconducting material. Although the select gates (or electrode) in FIGS. 15a–16 are shown to be larger than the floating gates (or electrode), they may be the same sizes. FIGS. 15a–15d are shown for illustration purposes only, and there may be numerous other structures that may provide an erase device.

Referring back to FIG. 12, erase device E20 includes a select gate 102, a floating gate 104 and an erase node 106. Select gate 102 is coupled to the select gate of NMOS transistor M20 and is controlled by control line 1 (CL1). Floating gate 104 of erase device E20 is coupled to the floating gate of NMOS transistor M20. Erase node 106 is coupled to an erase line (EL1). In a similar manner, erase device E40 is coupled to NMOS transistor M22. Both the select gates of E40 and M22 are controlled by control line 2 (CL2), and the floating gates of E40 and M22 are connected to each other, and the erase node of E40 is coupled to an erase line 2 (EL2).

Figure 13:
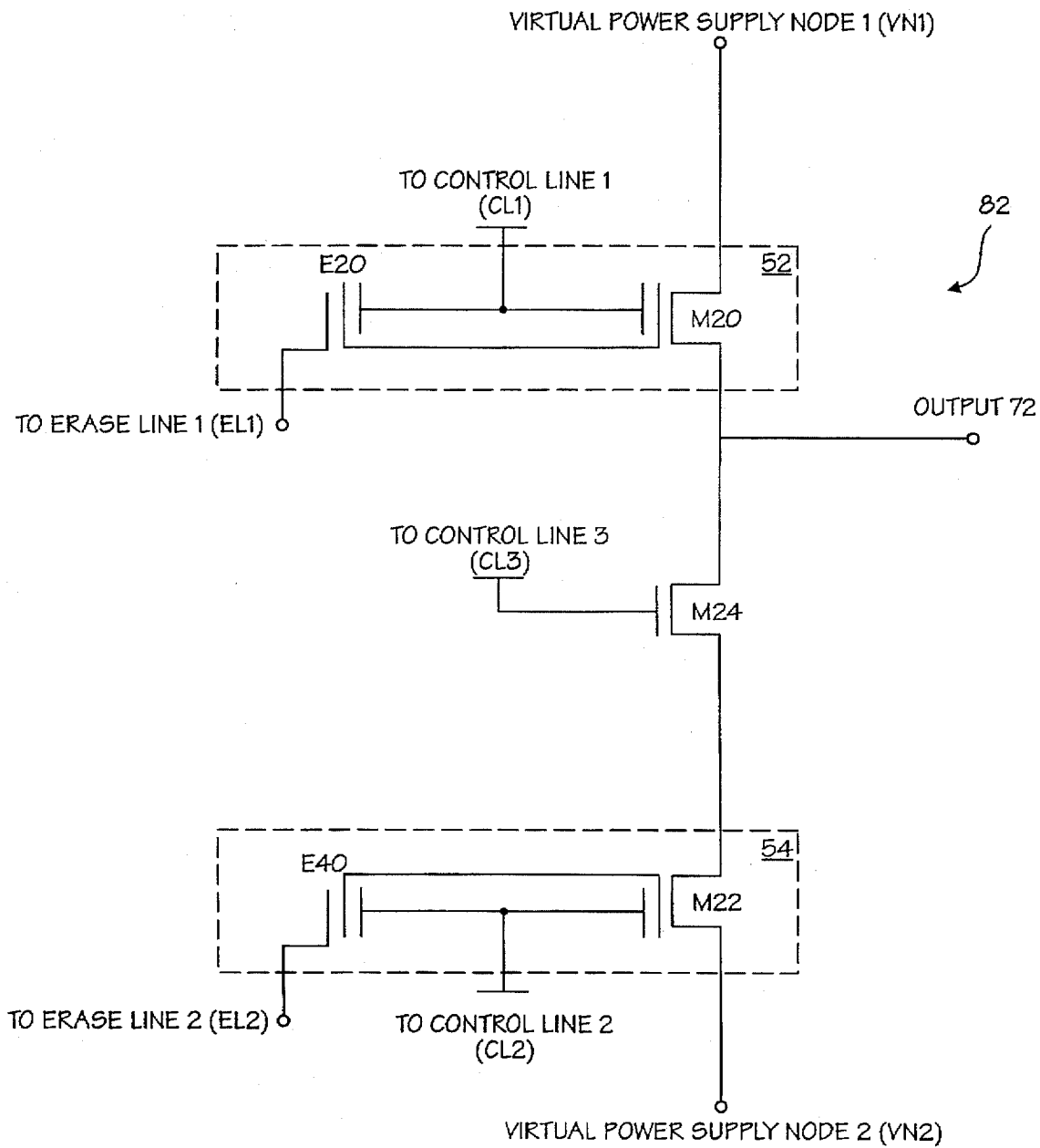
FIG. 13 is a circuit schematic representation of a configuration cell having erase devices according to another embodiment of the present invention.

Configuration cell 82, shown in FIG. 13, is substantially configuration cell 72 shown in FIG. 8, except that FIG. 13 also shows erase devices E20 and E40. The erase devices E20 and E40 are connected to NMOS transistors M20 and M22 in a manner similar to those shown in FIG. 12.

In FIGS. 12 and 13, output nodes 70 and 72 and virtual power supply nodes 1 and 2 are utilized not only for a read operation, but also for programming and erasing NMOS transistors M20 and M22. FIG. 14 summarizes various modes of operation of configuration cells 80 and 82 in FIGS. 12 and 13. To program NMOS transistor M20 in FIG. 12 or 13, control line 1 (CL1) is connected to a high voltage, typically much higher than Vcc (e.g., ~12V), erase line 1 (EL1) is also connected to a high voltage greater than Vcc (e.g., ~11V). Virtual power supply node 1 (VN1) is connected to a high voltage (e.g., ~7V), and output node 70 or 72 is connected to Vss or ground. To erase NMOS transistor M22 in FIG. 12 or 13, control line 2 (CL2) is connected to Vss or ground, the erase line 2 (EL2) is connected to a high voltage (e.g., ~11V). Also, control line 3 (CL3) in FIG. 13 is connected to Vss or ground. Virtual power supply node 2 (VN2) is connected to Vss or ground, and output node 70 or 72 is connected to Vss or ground.

Figure 20:
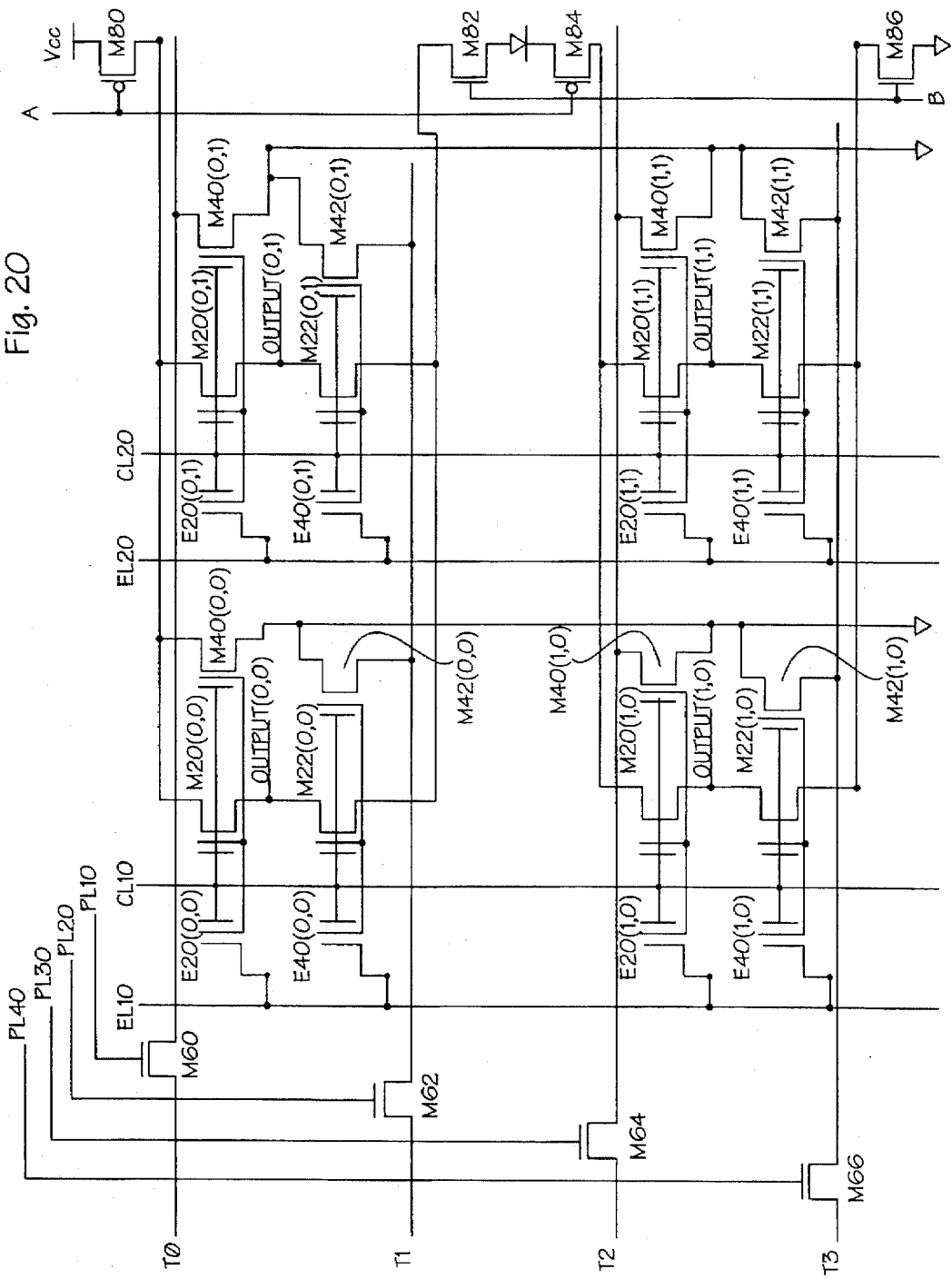
FIG. 20 is a configuration circuit having an array of configuration cells embodying features of the present invention.

To program M22 and erase M20, CL1, VN1 and output node 70 or 72 are connected to Vss or ground. EL1 and EL2 are connected to a high voltage (e.g., ~11V). CL2 and CL3 are connected to a high voltage (e.g., ~12V). VN2 is also connected to a high voltage (e.g., ~7V). It should be noted that programming one nonvolatile transistor and erasing another (e.g., erasing M20 and programming M22 or programming M20 and erasing M22) can be performed simultaneously or at different times. It is also possible to simultaneously erase M20 and M22 or to simultaneously program M20 and M22. However, in a typical application, while simultaneous erasing is common, only one of M20 or M22 is programmed. It should also be noted that control line 1 can be coupled to control line 2, and erase line 1 can be coupled to erase line 2. In that instance, programming M20 and erasing M22 will not be performed simultaneously. Such an example is shown in FIG. 20.

Continuing to refer to FIGS. 12, 13 and 14, during a read operation, which is the normal operation, control lines CL1, CL2 and CL3 are typically connected to Vcc which is usually 5V. EL1 and EL2 can be connected to either Vcc or Vcc-Vtn such that the floating gates of erase devices E20 and E40 are not disturbed during the operation. VN1 is typically connected to Vcc while VN2 is connected to Vss or ground. Output node 70 or 72 is high (Vcc) if M22 is programmed and M20 is erased. Output node 70 or 72 is low (Vss or ground) if M20 is programmed while M22 is erased.

Figure 17:
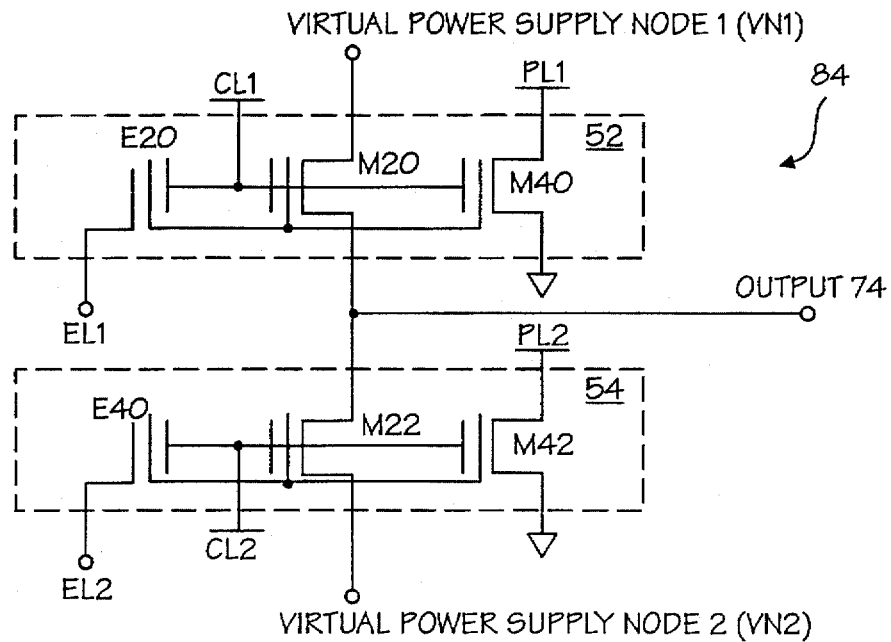
FIG. 17 is a circuit schematic representation of a configuration cell having erase read and programming devices according to one embodiment of the present invention.
Figure 18:
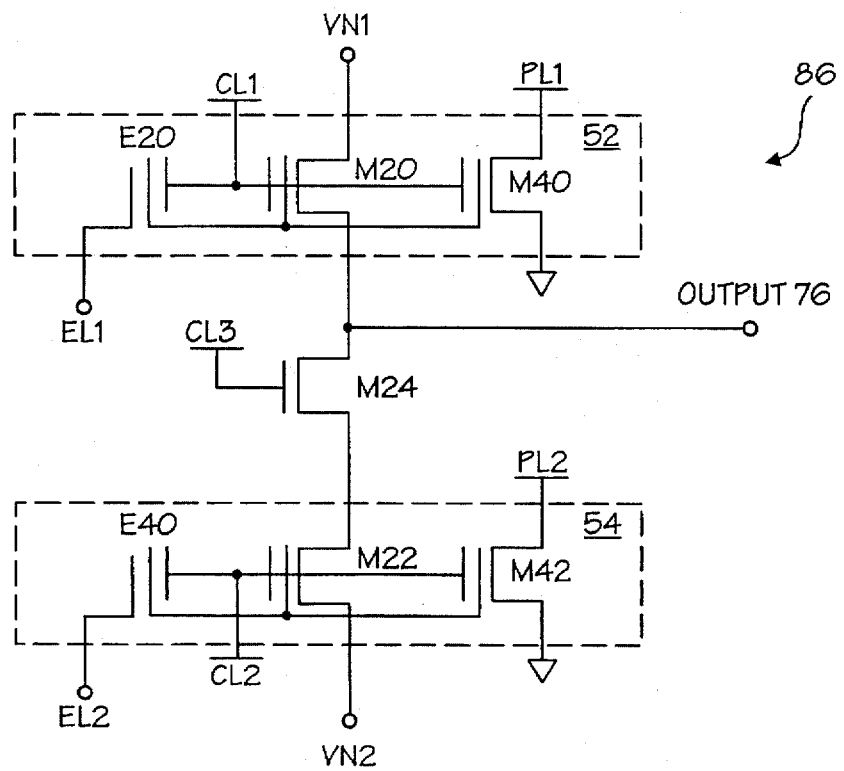
FIG. 18 is a circuit schematic representation of a configuration cell having erase, and programming devices according to another embodiment of the present invention.

Configuration cells 84 and 86 in FIGS. 17 and 18 are similar to those in FIGS. 12 and 13, respectively, except that each of configuration cells 84 and 86 includes dedicated programming devices M40 and M42 so that the signals at CL3, VN1, VN2, and output nodes 74 and 76 do not affect programming or erasing of M20 and M22. In FIG. 17, programming device M40 is a nonvolatile NMOS transistor having a select gate, floating gate, drain and source. The select gate of M40 is coupled to the select gates of E20 and M20 that are controlled by CL1. The floating gate of M40 is coupled to the floating gates of E20 and M20. The drain of M40 is coupled to a programming line 1 (PL1), and the source of M40 is coupled to Vss or ground. Programming device M42 is connected in a manner similar to programming device M40 except that M40 is coupled to devices E40 and M22 and programming line 2 (PL2).

Configuration cell 86 shown in FIG. 18, is substantially configuration cell 82 shown in FIG. 13, except that FIG. 18 also shows two dedicated programming devices M40 and M42. The electrical connections of programming devices M40 and M42 are similar to those shown in FIG. 17, and thus the description is omitted.

FIG. 19 summarizes various modes of operation of configuration cells 84 and 86. As indicated above, CL3, VN1, VN2, and output nodes 74 and 76 do not affect programming or erasing transistors M20 and M22 because the configuration cells 84 and 86 each have dedicated programming devices. To program M20, CL1, E1, and PL1 are connected to high voltages. To erase M22, CL2 and PL2 are connected to Vss or ground while EL2 is connected to a high voltage. Now, to program M22, CL2, EL2 and PL2 are connected to high voltages. To erase M20, CL1 and PL3 are connected to Vss or ground while EL1 is connected to a high voltage. The high voltages are typically higher than Vcc, and various voltages such as 12V, 11V or 7V can be used where Vcc is 5V. It should be noted that various other voltage values can be used depending on the particular technology used. As indicated earlier with respect to FIGS. 12–14, programming one nonvolatile transistor and erasing another (e.g., programming M20 and erasing M22 or erasing M20 and programming M22) can be performed simultaneously as described above or at different times.

In a read operation, CL1, CL2, CL3 and VN1 are typically connected to Vcc. EL1 and EL2 are connected to Vcc-Vtn or Vcc so that the charges on the floating gates are not disturbed. The lines PL1, PL2 and VN2 are typically coupled to Vss or ground. The output value at output node 74 or 76 is high (Vcc) if M22 is programmed and M20 is erased, and is low (Vss or ground) if M20 is programmed while M22 is erased.

FIG. 20 is a configuration circuit 90 having an array of configuration cells embodying features of the present invention. Configuration circuit 90 is a 2×2 array. Each cell includes a nonvolatile pull-up cell and a nonvolatile pull-down cell. Each configuration cell is substantially configuration cell 84 in FIG. 17 except that all of the cells along a column are commonly connected to one control line and one erase line (e.g., CL10, EL10, CL20, and EL20). Configuration circuit 90 includes row pass transistors M60, M62, M64 and M66 that are controlled by PL10, PL20, PL30, and PL40, respectively, and receive inputs from T0, T1, T2 and T3, respectively. The row pass transistors are coupled to programming devices in each of the configuration cells to enable the programming devices (e.g., M40 (0,0), M40 (0,1), M42 (0,0), M42 (0,1), M40 (1,0), M40 (1,1), M42 (1,0) and M42 (1,1)). Configuration circuit 90 further includes column pass transistors M80, M82, M84 and M86. The column pass transistors are controlled by control signals A and B. PMOS column pass transistors M80 and M84 are connected to nonvolatile NMOS transistors M20 (0,0), M20 (0,1), M20 (1,0), and M20 (1,1) to supply Vcc to those transistors during normal operation (non programming). NMOS column pass transistors M82 and M86 are connected to nonvolatile NMOS transistors M22 (0,0), M22 (0,1), M22 (1,0), and M22 (1,1) to supply Vss or ground to those transistors during normal operation.

FIG. 21 summarizes the states of the control lines during programming, erasing and reading of the configuration cells in FIG. 20. Prior to programming the configuration cells, a bulk erase operation is typically performed to erase all of the configuration cells in configuration circuit 90. This can be accomplished by applying high voltages to EL10 and EL20 and applying Vcc to control signal A while applying Vss or ground to all of the other control lines. When configuration circuit 90 is bulk erased, since all of the configuration cells can be conducting, control signal A is connected to Vcc while control signal B is connected to Vss or ground to avoid supplying power to the configuration cells. Thus, although all of the configuration cells are erased, no current will be conducting. It should be noted that a bulk erase can also be accomplished by using UV light.

FIG. 21 also describes how to program each of the devices M20 (0,0) M22 (1,1). For example, to program nonvolatile NMOS transistor M22 (0,1), PL10, PL30, PL40, EL10, CL10 and control signal B will be connected to Vss or ground. PL20, EL20 and CL20 will be connected to high voltages (typically greater than Vcc). Control signal A will be connected to Vcc.

Control signals A and B are typically controlled by a few (one or two) nonvolatile configuration cells which can be programmed to change the states of A and B—logic high and logic low. After configuration circuit 90 is programmed, the nonvolatile configuration cells for control signals A and B are programmed appropriately to change the states of control signals A and B to logic low and logic high, respectively.

In a read operation, which is the normal operation, PL10, PL20, PL30 and PL40 are typically connected to Vss or ground. EL10 and EL20 are connected to Vcc-Vtn or Vcc to avoid disturbing the charges on the floating gates, and CL10 and CL20 are connected to Vcc. Control signal A is at Vss or ground and control signal B is at Vcc so that Vcc and Vss (or ground) can be connected to the configuration cells. It should be noted that PL10, PL20, PL30 and PL40 can be all connected together so that all of the row pass transistors (M60, M62, M64 and M66) are controlled by one programming line. In that instance, although all the row pass transistors are on, not all of the programming devices (e.g., M40 (0,0), M40 (0,1), M42 (0,0), M42 (0,1), M40 (1,0), M40 (1,1), M42 (1,0) and M42 (1,1)) will be conducting since they depend on the input signals T0–T3. Only the programming devices having an input signal that is high will be conducting.

Although FIG. 20 illustrates a configuration circuit comprised of a plurality of configuration cells 84 shown in FIG. 17, there are numerous other embodiments of configuration circuits that employ other types of configuration cells, such as those depicted in FIGS. 11, 12, 13, 17, and 18 which have been discussed above.

Because of the various unique features, the present invention provides several advantages over the prior art configuration cells. First, the configuration cells of the present invention consume considerably less area. Hence, the present invention is particularly useful for memory chips that require a large number of configuration cells.

Second, the present invention does not require a special sense amplifier, a power-up control circuitry or a reference generator. In the present invention, a configuration cell only requires nonvolatile pull-up and pull-down cells as shown in FIG. 5 wherein each of the nonvolatile cells includes at least one nonvolatile device.

Third, a read path transistor in the configuration cell (e.g., M24 in FIG. 8) used in the present invention does not need to be large and can be eliminated entirely as shown in FIG. 7a.

Finally, while nonvolatile transistors of conventional configuration cells (e.g., M4 and M5 in FIG. 3) must be sized properly to provide adequate sense current to its sense amplifier, because the present invention does not need to sense the current in the configuration cells, the nonvolatile transistors of the present invention's configuration cells can be made as small as the technology employed will allow.

While the present invention has been particularly described with reference to the various figures and embodiments, it should be understood that these are for illustration only and should not be taken as limiting the scope of the invention. Many changes and modifications may be made to the invention, by one having ordinary skill in the art, without departing from the spirit and scope of the invention.

What is claimed is:

1. A programmable configuration device comprising:

a nonvolatile pull-up cell including a depletion-type first nonvolatile transistor coupled to a first output node and for coupling to a first power supply voltage;

a nonvolatile pull-down cell including an enhancement-type second nonvolatile transistor coupled to said nonvolatile pull-up cell and to said first output node and for coupling to a second power supply voltage, wherein said first output node is directly coupled to a controlled circuit.

2. The programmable configuration device according to claim 1, wherein said first nonvolatile transistor is for coupling to said first power supply voltage, and said first nonvolatile transistor has its output connected to said first output node; and wherein said second nonvolatile transistor is coupled to said first nonvolatile transistor and is for coupling to said second power supply voltage, and said second nonvolatile transistor has its output connected to said first output node.

3. The programmable configuration device according to claim 2, wherein said nonvolatile pull-down cell further includes a volatile transistor coupled between said first and second nonvolatile transistors and coupled to said first output node.

4. The programmable configuration device according to claim 1, wherein full rail logic levels are achieved at said first output node.

5. The programmable configuration device according to claim 1, wherein the programmable configuration device further includes:

a first erase device coupled to said first nonvolatile transistor for discharging charges on a first floating gate of said first nonvolatile transistor; and a second erase device coupled to said second nonvolatile transistor for discharging charges on a second floating gate of said second nonvolatile transistor.

6. The programmable configuration circuit according to claim 5, wherein said first nonvolatile transistor includes a first select gate, said first floating gate, a first drain, and a first source, wherein said second nonvolatile transistor includes a second select gate, said second floating gate, a second drain, and a second source, wherein said first erase device includes a third select gate, a third floating gate, and a third drain, wherein said second erase device includes a fourth select gate, a fourth floating gate, and a fourth drain, wherein said first and third select gates are coupled to each other and are for being controlled by a first control signal, wherein said first and third floating gates are coupled to each other, wherein said first drain is for coupling to said first power supply voltage, wherein said first source and said second drain are coupled to said first output node, wherein said third drain is for coupling to a first erase signal, wherein said second and fourth select gates are coupled to each other and are for being controlled by a second control signal, wherein said second and fourth floating gates are coupled to each other, wherein said second source is for coupling to said second power supply voltage, and wherein said fourth drain is for coupling to a second erase signal.

7. The programmable configuration device according to claim 1, wherein said first nonvolatile transistor is an N-type MOSFET having a floating gate; and said second nonvolatile transistor is an N-type MOSFET having a floating gate.

8. The programmable configuration circuit according to claim 1, wherein said first nonvolatile transistor is a depletion-type MOSFET having a floating gate.

9. The programmable configuration device according to claim 1, wherein said first nonvolatile transistor is a P-type MOSFET having a floating gate; and said second nonvolatile transistor is an N-type MOSFET having a floating gate.

10. The programmable configuration device according to claim 9, wherein said floating gate of said P-type MOSFET is connected to said floating gate of said N-type MOSFET.

11. The programmable configuration device according to claim 1, wherein erasing of said nonvolatile pull-up cell and programming of said nonvolatile pull-down cell are performed simultaneously; and wherein erasing of said nonvolatile pull-down cell and programming of said nonvolatile pull-up cell are performed simultaneously.

12. The programmable configuration device according to claim 1, wherein when said nonvolatile pull-up cell is erased, said nonvolatile pull-down cell is programmed, and when said nonvolatile pull-up cell is programmed, said nonvolatile pull-down cell is erased so that only one of said nonvolatile pull-up cell or said nonvolatile pull-down cell conducts.

13. The programmable configuration device according to claim 1, wherein the programmable configuration device does not require a sense amplifier, a power-on reset circuitry, or a reference voltage generator.

14. The programmable configuration device according to claim 1 further including:

a first virtual power supply node coupled to said nonvolatile pull-up cell;

a second virtual power supply node coupled to said nonvolatile pull-down cell;

a first gate control line for controlling an input of said nonvolatile pull-up cell;

a second gate control line for controlling an input of said nonvolatile pull-down cell;

a first pass circuit coupled to said first virtual power supply node and for coupling to said first power supply voltage;

a second pass circuit coupled to said second virtual power supply node and for coupling to said second power supply voltage;

a first pass control line for controlling said first pass circuit; and a second pass control line for controlling said second pass circuit.

15. The programmable configuration device according to claim 14, wherein in a read mode, (1) said first and second gate control lines are at the same voltage level, (2) said first and second pass circuits are on so that said nonvolatile pull-up cell is coupled to said first power supply voltage, and (3) said nonvolatile pull-down cell is coupled to said second power supply voltage.

16. The programmable configuration device according to claim 14 further including:

a second nonvolatile pull-up cell connected to a second output node and coupled to said first pass circuit;

a second nonvolatile pull-down cell coupled to said second nonvolatile pull-up cell, to said second output node and to said second pass circuit;

a third gate control line for controlling an input of said second nonvolatile pull-up cell; and a fourth gate control line for controlling an input of said second nonvolatile pull-down.

17. The programmable configuration device according to claim 16, wherein said first output node and said second output node are electrically isolated from each other.

18. The programmable configuration device according to claim 1, wherein said nonvolatile pull-up cell further includes a third nonvolatile transistor for programming said nonvolatile pull-up cell, and wherein said nonvolatile pull-down cell further includes a fourth nonvolatile transistor for programming said nonvolatile pull-down cell.

19. The programmable configuration circuit according to claim 18, wherein said first nonvolatile transistor includes a first select gate, a first floating gate, a first drain, and a first source, wherein said second nonvolatile transistor includes a second select gate, a second floating gate, a second drain, and a second source, wherein said third nonvolatile transistor includes a third select gate, a third floating gate, a third drain, and a third source, wherein said fourth nonvolatile transistor includes a fourth select gate, a fourth floating gate, a fourth drain, and a fourth source, wherein said first and third select gates are coupled to each other and are for being controlled by a first control signal, wherein said first and third floating gates are coupled to each other, wherein said first drain is for coupling to said first power supply voltage, wherein said first source and said second drain are coupled to said first output node, wherein said third drain is for coupling to a first programming signal, wherein said third source is for coupling to said second power supply voltage, wherein said second and fourth select gates are coupled to each other and are for being controlled by a second control signal, wherein said second and fourth floating gates are coupled to each other, wherein said second source is for coupling to said second power supply voltage, wherein said fourth drain is for coupling to a second programming signal, and wherein said fourth source is for coupling to said second power supply voltage.

20. The programmable configuration device according to claim 19, wherein the programmable configuration device further includes:

a first erase device coupled to said first nonvolatile transistor for discharging charges on said first floating gate; and a second erase device coupled to said second nonvolatile transistor for discharging charges on said second floating gate, wherein said first erase device includes a fifth select gate, a fifth floating gate, and a fifth drain, wherein said second erase device includes a sixth select gate, a sixth floating gate, and a sixth drain, wherein said first and fifth select gates are coupled to each other and are for being controlled by said first control signal, wherein said first and fifth floating gates are coupled to each other, wherein said fifth drain is for coupling to a first erase signal, wherein said second and sixth select gates are coupled to each other and are for being controlled by said second control signal, wherein said second and fourth floating gates are coupled to each other, and wherein said sixth drain is for coupling to a second erase signal.

21. A programmable configuration device as in claim 1 wherein said controlled circuit is a macrocell.

22. A method of operating a programmable configuration device, said programmable configuration device including (1) a nonvolatile pull-up cell having a depletion-type first nonvolatile transistor coupled to an output node and for coupling to a first power supply voltage, (2) a nonvolatile pull-down cell having an enhancement-type second nonvolatile transistor coupled to said nonvolatile pull-up cell and to said output node and for coupling to a second power supply voltage, wherein said output node is directly coupled to a controlled circuit, the method comprising the steps of:

erasing at least one of said first or second nonvolatile transistors;

programming at least one of said first or second nonvolatile transistors; and reading a logic stored in said programmable configuration device.

23. The method according to claim 22, wherein said steps of erasing and programming are done simultaneously.

24. The method according to claim 22, wherein only one of said first or second nonvolatile transistors is programmed.

25. The method according to claim 22, wherein said step of erasing includes erasing both said first and second nonvolatile transistors.

26. The method according to claim 22,
wherein said step of reading comprises the steps of:
applying said first power supply voltage to said first nonvolatile transistor;
applying said second power supply voltage to said second nonvolatile transistor;
applying a first predetermined control voltage to said first nonvolatile transistor;
applying a second predetermined control voltage to said second nonvolatile transistor; and
reading the logic from said output node.

27. The method according to claim 22, wherein said nonvolatile pull-up cell includes an N-type nonvolatile transistor, and said nonvolatile pull-down cell includes an N-type nonvolatile transistor.

28. The method according to claim 22, wherein said nonvolatile pull-up cell includes a P-type nonvolatile transistor, and said nonvolatile pull-down cell includes a P-type nonvolatile transistor.

29. The method according to claim 22, wherein said nonvolatile pull-up cell includes a P-type nonvolatile transistor, and said nonvolatile pull-down cell includes an N-type nonvolatile transistor.

30. The method according to claim 22, wherein full rail logic levels are achieved at said output node.

31. The method according to claim 22, wherein if said nonvolatile pull-down cell is programmed, then an output at said output node is high; and
wherein if said nonvolatile pull-up cell is programmed, then an output at said output node is low.

32. The method according to claim 22 wherein said controlled circuit is a macrocell.

33. A configuration circuit comprising:
a plurality of cells, each cell including:
a nonvolatile pull-up cell having a depletion-type first nonvolatile transistor, a nonvolatile pull-down cell having an enhancement-type second nonvolatile transistor, and a cell output node, wherein said cell output node is directly coupled to a controlled circuit,
said nonvolatile pull-up and pull-down cells coupled to said cell output node,
said nonvolatile pull-up cell for coupling to a first power supply voltage through a first pass circuit,
said nonvolatile pull-down cell for coupling to a second power supply voltage through a second pass circuit.

34. The configuration circuit according to claim 33, wherein said nonvolatile pull-up cell further includes
a third nonvolatile transistor and a first erase device coupled to one another, and
wherein said nonvolatile pull-down cell further includes a fourth nonvolatile transistor and a second erase device coupled to one another.

35. The configuration circuit according to claim 34, wherein said third nonvolatile transistor is coupled to a third pass circuit, and
said fourth nonvolatile transistor is coupled to a fourth pass circuit.

36. The configuration circuit according to claim 33, wherein said nonvolatile pull-up cell further includes a third nonvolatile transistor coupled to said first nonvolatile transistor for programming said nonvolatile pull-up cell, and
wherein said nonvolatile pull-down cell further includes a fourth nonvolatile transistor coupled to said second nonvolatile transistor for programming said nonvolatile pull-down cell.

37. The configuration circuit according to claim 33, wherein said nonvolatile pull-up cell further includes a first erase device coupled to said first nonvolatile transistor, and
wherein said nonvolatile pull-down cell further includes a second erase device coupled to said second nonvolatile transistor.

38. A configuration circuit as in claim 33 wherein said controlled circuit is a macrocell.

* * * * *